United States Patent
Uchida (10) Patent No.: US 7,363,597 B2
(45) Date of Patent: Apr. 22, 2008

(54) SYSTEM FOR PLACING ELEMENTS OF SEMICONDUCTOR INTEGRATED CIRCUIT, METHOD OF PLACING ELEMENTS THEREON, AND PROGRAM FOR PLACING ELEMENTS (75) Inventor: Kohei Uchida, Tokyo (JP)

(73) Assignee: NEC Corporation, Tokyo (JP)

( * ) Notice: Subject to any disclaimer, the term of this patent is extended or adjusted under 35 U.S.C. 154(b) by 370 days.

(21) Appl. No.: 11/178,351

(22) Filed: Jul. 12, 2005

(65) Prior Publication Data
US 2006/0013059 A1 Jan. 19, 2006

(30) Foreign Application Priority Data
Jul. 13, 2004 (JP) ............... 2004-206324

(51) Int. Cl.
G06F 17/50 (2006.01)
(52) U.S. Cl. ............... 716/1; 716/8; 716/9; 716/10; 716/11
(58) Field of Classification Search ............... 716/1, 716/8–11
See application file for complete search history.

(56) References Cited

U.S. PATENT DOCUMENTS

| 6,044,209 | A | * | 3/2000 | Alpert et al. | 716/6 |
| 6,305,002 | B1 | * | 10/2001 | Uchida | 716/12 |
| 6,480,992 | B1 | * | 11/2002 | Runyon | 716/10 |
| 6,557,154 | B1 | * | 4/2003 | Harada et al. | 716/11 |
| 6,782,347 | B2 | * | 8/2004 | Hirano et al. | 702/183 |
| 6,834,380 | B2 | * | 12/2004 | Khazei | 716/10 |
| 6,877,144 | B1 | * | 4/2005 | Rittman et al. | 716/10 |
| 6,898,769 | B2 | * | 5/2005 | Nassif et al. | 716/5 |
| 6,996,512 | B2 | * | 2/2006 | Alpert et al. | 703/14 |
| 7,089,520 | B2 | * | 8/2006 | Voldman | 716/9 |
| 7,131,084 | B2 | * | 10/2006 | Cannon et al. | 716/5 |
| 2002/0065643 | A1 | * | 5/2002 | Hirano et al. | 703/19 |

FOREIGN PATENT DOCUMENTS

JP H11-168177 A 6/1996

* cited by examiner

Primary Examiner—Jack Chiang
Assistant Examiner—Naum B. Levin
(74) Attorney, Agent, or Firm—Sughrue Mion, PLLC (57) ABSTRACT An element placement system including a placement and routing library that stores element information about logical elements to be placed, placement information containing region information of regions in which logical elements can be placed, and routing information necessary to execute routing, a placement improvement library that stores specified element information about specified logical elements being logical elements specified to place capacitors in the vicinity thereof, a placement unit that places logical elements according to input data containing connection data between logical elements and the placement information stored in the placement and routing library, a placement improvement unit that improves a result of placement by the placement unit by moving logical elements other than specified logical elements stored in the placement improvement library to collect spaces into the vicinity of the specified logical elements, a routing unit that routes logical elements after placement improvement by the placement improvement unit based on the input data, and a capacitor generation unit that places capacitors in the collected spaces.

16 Claims, 6 Drawing Sheets

FIG.1

EXAMPLE OF CONTENTS OF PLACEMENT IMPROVEMENT LIBRARY

| SPACE ALLOCATION MODE | RELATIVE WEIGHTING | ON | | |
|---|---|---|---|---|
| SPACE ALLOCATION MODE | EQUAL | OFF | | |
| PRIORITY MODE | PRIORITY LEVEL | | | |
| RELATIVE WEIGHTING | 1 | | | |
| SIDE | 2 | | | |
| MINIMUM SPACE | 3 | | | |
| FUNCTION BLOCK NAME | RELATIVE WEIGHTING | SPACE REQUIRED AT LEAST | REQUIRED AT EACH SIDE | ATTRIBUTE ON NOISE |
| ... | | | | |
| INVERTERX10 | 1 | 10 | YES | AGGRESSOR |
| FLIPFLOPX1 | 2 | 20 | NO | VICTIM |
| ... | | | | |

SYSTEM FOR PLACING ELEMENTS OF SEMICONDUCTOR INTEGRATED CIRCUIT, METHOD OF PLACING ELEMENTS THEREON, AND PROGRAM FOR PLACING ELEMENTS

BACKGROUND OF THE INVENTION

1. Field of the Related Art

The present invention relates to a semiconductor integrated circuit, a method of placing elements formed thereon, and a program for placing the elements, and more particularly to a technique for placing on-chip capacitors for controlling the influence of noise in placement design of LSI design CAD.

2. Description of the Related Art

In the design of a semiconductor integrated circuit (also referred to as LSI), small circuits such as NAND, NOR, inverter circuits, and the like called function blocks that perform basic operations are placed in an LSI (large scale integrated circuit) to be produced on a computer program, and routings among the circuits are connected to produce basic data of a mask used for semiconductor manufacturing. This process is referred to as placement and routing processing.

The placement and routing processing is performed mainly by a routing program and a placement program. Conventional placement programs have performed placement with the purpose of putting routing-caused delay and routing space within target values.

However, recent, very fast LSIs are afflicted with the generation of noise during operation of function blocks. To control the influence of noise, it is effective to place on-chip capacitors in spaces inside an LSI. The on-chip capacitors are capacitors employing PN junction capacitances and gate capacitances.

A method of placing on-chip capacitances in LSI design is described by an invention of JP-A 168177/1999. Although on-chip capacitors produced by the invention are placed in spaces of a placement result decided only with delay constraints, they are not placed with consideration to function blocks prone to generate noise and function blocks susceptible to noise.

The on-chip capacitors exhibit higher effects when they are placed nearer to the vicinity of noise source and the vicinity of function blocks susceptible to noise. However, since conventional placement programs do not take the generation of noise into account, it has been impossible to effectively place the on-chip capacitors in the vicinity of a noise source and function blocks susceptible to noise.

According to the invention in JP-A 168177/1999, as the number of function blocks mounted in a placement area increases, tiny spaces will occur between the function blocks. Since an on-chip capacitor requires a space of some width, it is difficult to effectively place on-chip capacitors in an environment interspersed with tiny spaces.

SUMMARY OF THE INVENTION

A first exemplary feature of the present invention is to provide a semiconductor integrated circuit, a method of placing elements thereon, and a program for placing the elements that enable on-chip capacitors to be more effectively placed by previously specifying function blocks in the vicinity of which the on-chip capacitors are to be placed, and moving interspersed small spaces to the vicinity of the function blocks and merging them, and can control noise generated in an LSI.

A second exemplary feature of the present invention is to provide a semiconductor integrated circuit, a method of placing elements thereon, and a program for placing the elements that make it possible to allocate spaces for more effectively placing capacitors by expanding the range of function block movement to adjacent or other row areas, and can significantly reduce the generation and influence of noise inside an LSI.

1. An element placement system of the present invention including:

a placement and routing library that stores placement information including element information about logical elements to be placed and region information of regions in which logical elements can be placed, and routing information necessary to execute routing;

a placement improvement library that stores specified element information about specified logical elements being logical elements specified to place capacitors in the vicinity thereof;

a placement unit that places logical elements according to input data containing connection data between logical elements and the placement information stored in the placement and routing library;

a placement improvement unit that improves a result of placement by the placement unit by moving logical elements other than specified logical elements stored in the placement improvement library to collect spaces into the vicinity of the specified logical elements;

a routing unit that routes logical elements after placement improvement by the placement improvement unit based on the input data; and a capacitor generation unit that places capacitors in the collected spaces.

2. The element placement system of the present invention, wherein the placement improvement unit, after moving logical elements other than the specified logical elements, moves the specified logical elements to further collect spaces.

3. The element placement system according of the present invention, wherein the specified element information stored in the placement improvement library includes the names of the specified logical elements, the size of capacitors to be placed in the vicinity of the specified logical elements, and placement side information specifying whether to place the capacitors to be placed at one side or each side of the specified logical elements, and the placement improvement unit collects spaces into one side or each side of the specified logical elements according to the placement side information.

4. The element placement system according of the present invention, further including:

a placement addition unit that executes addition or change of logical elements for routings not satisfying preset conditions as a result of routing by the routing unit, including a process of inserting logical elements, which are relay use buffers, wherein after addition or change of logical elements by the placement addition unit, the placement improvement unit moves the added or changed logical elements, and the routing unit routes portions that have become necessary to replace as a result of the addition or change of logical elements.

5. The element placement system according of the present invention,
wherein the capacitors include a plurality of capacitors different in size, and the capacitor generation unit selectively places the largest mountable capacitor that is permitted for the size of spaces to place the capacitors in.

6. The element placement system according of the present invention,
wherein the logical elements are function blocks, which are small circuits that are mounted in a semiconductor integrated circuit and perform basic operations.

7. The element placement system according of the present invention,
wherein the placement improvement unit can, for a result of placement by the placement unit, move logical elements other than the specified logical elements stored in the placement improvement library to not only spaces of a row area in which the specified logical elements are placed, but also spaces of other row areas, to collect spaces into the vicinity of the specified logical elements.

8. An element placement method of the present invention, including:
   a) after placing logical elements to be mounted;
   b) of logical elements, for specified logical elements previously specified to place capacitors in the vicinity thereof, moving logical elements other than the specified logical elements to collect spaces into the vicinity of the specified logical elements, the logical elements being placed in the vicinity of the specified logical elements; and
   c) placing the capacitors in the collected spaces.

9. The element placement method according of the present invention, further including:
   b1) of logical elements, for specified logical elements previously specified to place capacitors in the vicinity thereof, moving logical elements other than the specified logical elements to not only spaces of a row area in which the specified logical elements are placed, but also spaces of other row areas, to collect spaces into the vicinity of the specified logical elements, the logical elements being placed in the vicinity of the specified logical elements.

10. The element placement method of the present invention, further including:
   b2) after moving logical elements other than the specified logical elements, moving the specified logical elements to further collect spaces.

11. An element placement method of the present invention, including:
   a step a) of placing logical elements according to input data containing connection data between logical elements, and information about logical elements to be placed and placement information containing information of regions in which logical elements can be placed, the information about logical elements and the placement information being stored in a placement and routing library;
   a step b) of, for a result of the placement execution, referring to a placement improvement library that stores specified element information about specified logical elements specified to place capacitors in the vicinity thereof and moving logical elements other than the specified logical elements to collect spaces into the vicinity of an area in which the specified logical elements are placed;
   a step c) of, for the moved logical elements, executing routing based on the input data and routing information necessary to execute routing stored in the placement and routing library; and
   a step d) of placing capacitors in the collected spaces.

12. The element placement method of the present invention, further including:
   a step e) of moving logical elements other than the specified logical elements in the step of moving logical elements other than specified logical elements, and then moving the specified logical elements to further collect spaces.

13. The element placement method according to of the present invention,
wherein the specified element information stored in the placement improvement library includes the names of the specified logical elements, the size of capacitors to be placed in the vicinity of the specified logical elements, and placement side information specifying whether to place the capacitors to be placed at one side or each side of the specified logical element, and in the step of moving logical elements, the specified logical elements or other logical elements are moved to collect spaces into one side or each side of the specified logical elements according to the placement side information.

14. The element placement method of the present invention, further including:
   a step f of executing addition or change of logical elements for routings not satisfying preset conditions as a result of routing after the step of executing routing, including a process of inserting logical elements, which are relay use buffers, and
   a step g of moving the added or changed logical elements to collect spaces into the vicinity of an area in which the specified logical elements are placed; and
   a step h of routing portions that have become necessary to replace as a result of the addition or change of logical elements for the result of routing.

15. The element placement method of the present invention,
wherein the capacitors include a plurality of capacitors different in size, and in the step d of placing the capacitors in the collected spaces, the largest mountable capacitor is selectively placed that is permitted for the size of spaces to place the capacitors in.

16. The element placement method of the present invention,
wherein the logical elements are function blocks which are small circuits that are mounted in a semiconductor integrated circuit and perform basic operations.

17. The element placement method of the present invention, further including:
   b1) of logical elements, for the specified logical elements previously specified to place capacitors in the vicinity thereof, moving logical elements other than the specified logical elements to not only spaces of a row area in which the specified logical elements are placed, but also spaces of other row areas, to collect spaces into the vicinity of the specified logical elements, the logical elements being placed in the vicinity of the specified logical elements.

Exemplary advantage of the invention is that noise generated in an LSI can be controlled because places effective to control noise inside an LSI are selected to provide spaces and on-chip capacitors are placed in the spaces.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying, wherein:

FIGS. 3A, 3B, 3C, and 3D are placement drawings for explaining space generation processing of a first embodiment of the present invention, wherein

FIG. 5 is placement drawings for explaining space generation processing of a second embodiment of the present invention, wherein

DETAILED DESCRIPTION OF THE PREFERRED EMBODIMENTS

Hereinafter, preferred embodiments of the present invention will be described in detail with reference to the accompanying drawings. An element placement system of a first embodiment of the present invention (hereinafter referred to as a first element placement system) is achieved by a computer. The computer includes a CPU to execute programs, a storage unit to store data and programs, and input/output units to input and output data.

Figure 1:
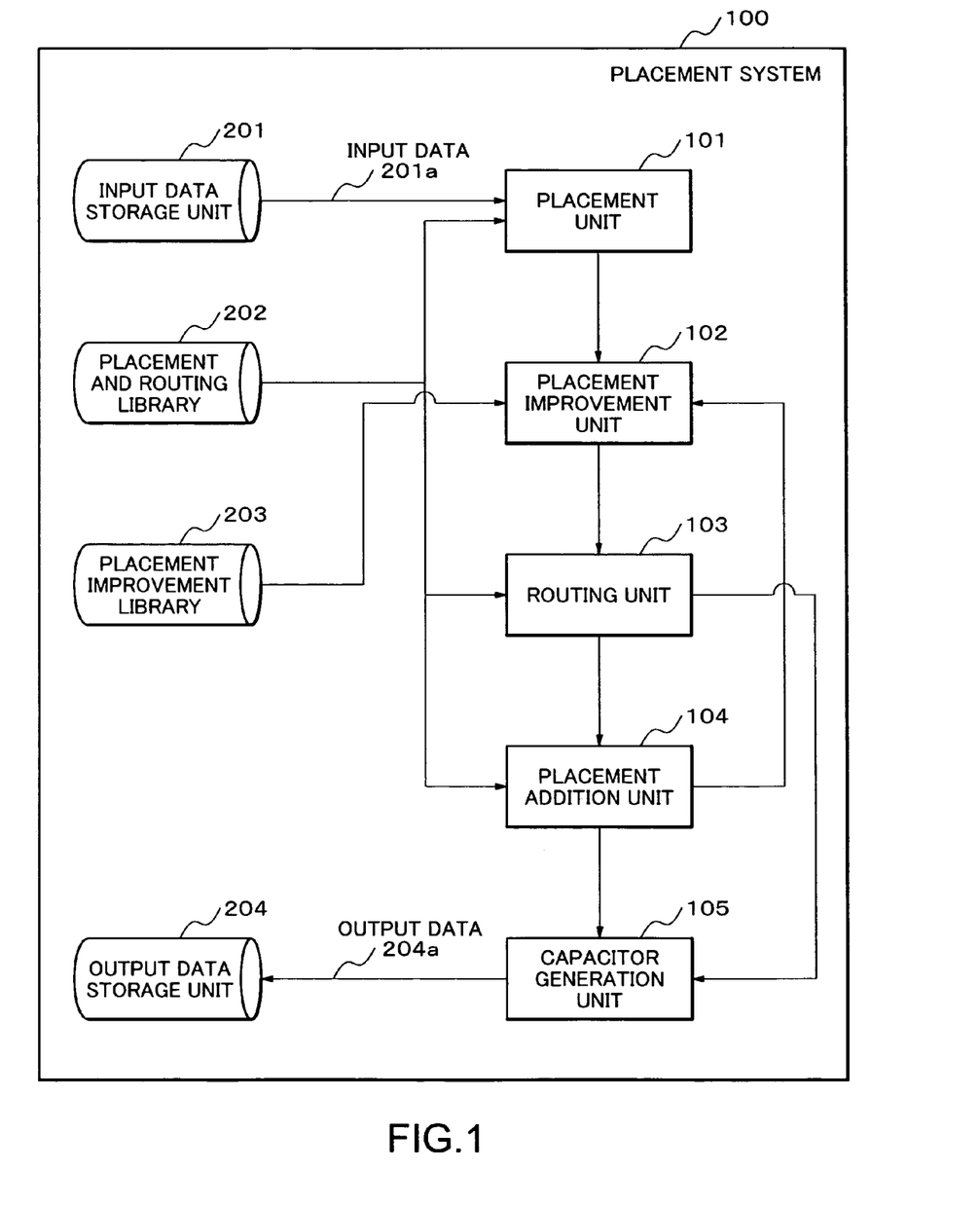
FIG. 1 is a drawing showing the configuration of an element placement system of the present invention.

Referring to FIG. 1, a first element placement system 100 includes a placement unit 101, a first placement improvement unit 102, a first routing unit 103, a placement addition unit 104, a second placement improvement unit 102, a second routing unit 103, and a capacitor generation unit 105. These functions are respectively realized by programs. The first element placement system 100 includes an input data storage unit 201 that temporarily or permanently holds input data 201a as required, and a placement and routing library 202 that temporarily or permanently holds information referenced during execution of placement and routing. The first element placement system 100 includes a placement improvement library 203 that temporarily or permanently holds information for improving a placement as required, and an output data storage unit 204 that temporarily or permanently holds output data 204a as required. These storage units 201 and 202, and libraries 202 and 203 may be memories, external storage units such as disk drives, and other information storage devices.

The input data 201a (also referred to as a net list 201a) generally includes data indicating connections between function blocks called a net list, and before being processed, is read into the input data storage unit 201 of the computer and held. The output data 204a results from a placement and routing process and is generally equivalent to data called mask data. It is outputted to the outside of the computer after processing, while it is temporarily held in the output data storage unit 204 for the duration of processing.

The placement and routing library 202, generally required by a placement and routing program, contains information referenced when the placement unit 101 executes placement or the routing unit 103 executes routing. The following information is stored in the placement and routing library 202: information about function blocks such as the size of each function block and pin positions, information about LSI such as the placement of power supply lines and ground lines on LSI, and the positions in which function blocks can be mounted, and information about regions in which routings can be executed. Information about the size of each function block and the positions in which function blocks can be mounted is used as placement information, and information about the pin position of each function block and the regions in which routings can be executed is used as routing information.

The placement improvement library 203, which is a library characteristic of the present invention, registers function blocks which are susceptible to noise and in the vicinity of which on-chip capacitors should be desirably placed, function blocks which are prone to generate noise and in the vicinity of which on-chip capacitors should be desirably placed, and specification and priority of modes for improving a placement.

Figure 2:
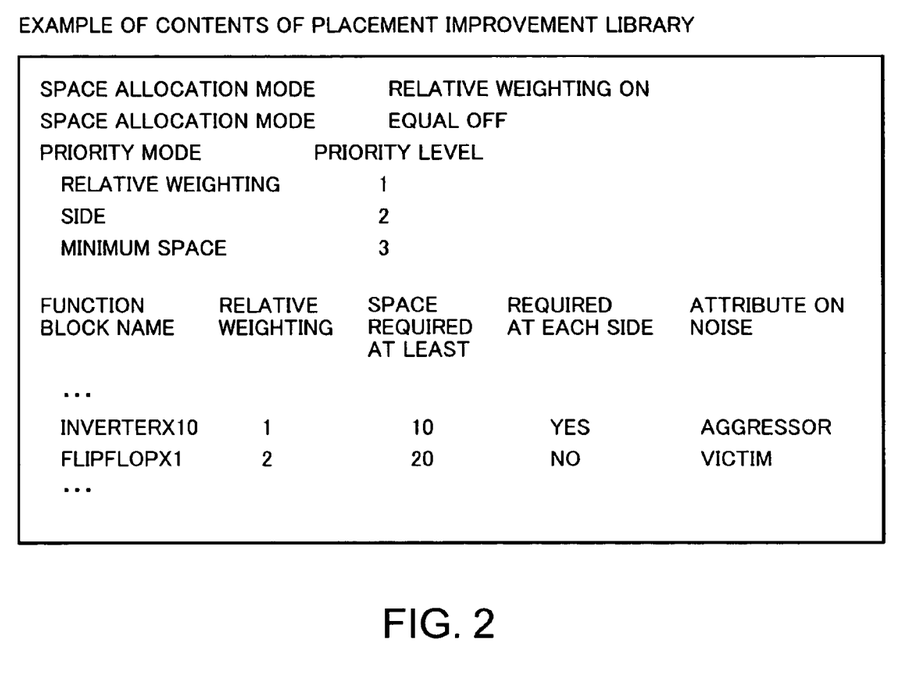
FIG. 2 is a drawing showing an example of a placement improvement library of the present invention.

FIG. 2 is a drawing showing an example of information stored in the placement improvement library 203. The placement improvement library 203 contains a method of allocating spaces when target function blocks are placed across spaces, priority of limitations on the spaces, the kinds of the target function blocks, and specification for the function blocks.

Specification for function blocks contains relative weight for indicating the relative importance of the function blocks, a minimum size of a space required at either side, information indicating whether a space is required at each side or one side, and information indicating whether the function blocks generate noise or are susceptible to noise.

Space allocation mode indicates whether spaces are split based on relative weighting or split evenly. In FIG. 2, relative weighting takes precedence. Priority mode indicates the priorities in which to determine space allocation. In FIG. 2, relative weighting has the highest priority and its priority is 1. The priority of whether a space is required at each side is 2. Spaces required at at least one side have the lowest priority and their priority is 3. A higher degree of tolerance for dissatisfaction is given to items of lower priorities.

FIG. 2 shows that "InverterX10" and "FlipFlopX1" are registered as function blocks. For example, in "Inverterx10," attribute on noise is a function block "Aggressor" that is prone to generate noise, "10" is required as a minimum size of space, and a space is required at each side because the item indicating whether a space is required at each side is YES. In "FlipFlopX1," attribute on noise is a function block that is susceptible to noise, "20" is required as a minimum size of space, and a space is required at one side because the item indicating whether a space is required at each side is NO.

The placement unit 101 places function blocks taking delays between the function blocks and the degree of routing congestion into account, based on the coupling information between the function blocks described in the net list (input data) 201a.

The placement improvement unit 102 moves the placement of function blocks to collect spaces between function blocks placed by the placement unit 101 into the vicinity of function blocks requiring spaces, based on information of the placement improvement library 203.

The routing unit 103 performs routing between function blocks based on the coupling information between the function blocks described in the net list (input data) 201a.

The placement addition unit 104 adds new function blocks to shorten routing length when it is determined as a result of routing that too long routing blocks the admission of delay or a propagation waveform becomes dull. This function is not a major function of the present invention, and therefore it will not be described in detail.

The capacitor generation unit 105 places an on-chip capacitor (also referred to as a capacitor) in a space generated after a function block is moved, and outputs the result of the placement as output data 204.

Figure 3A:
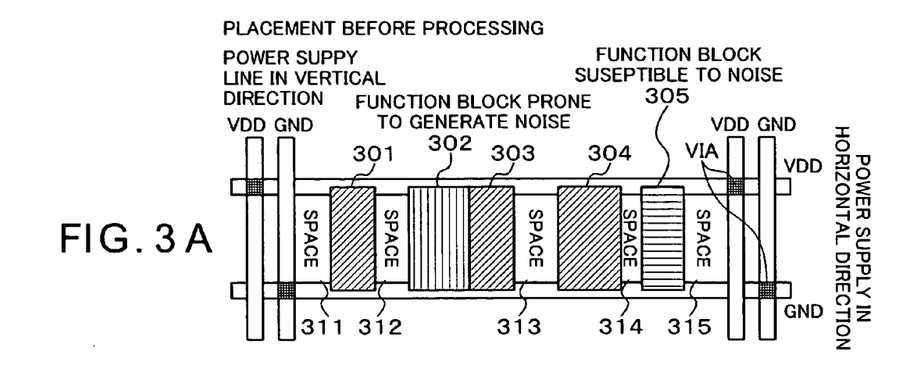
FIG. 3A is a drawing showing a placement before space movement processing.
Figure 3B:
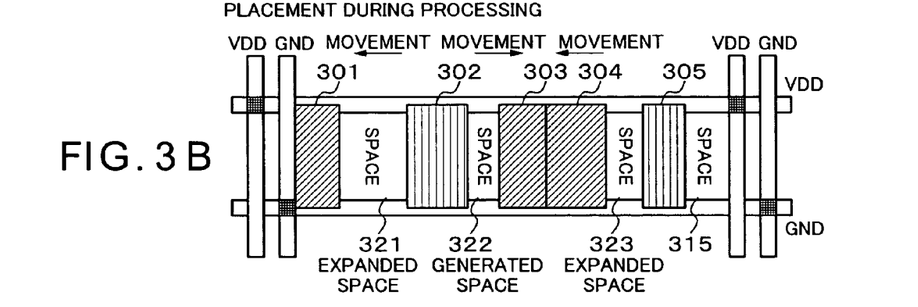
FIG. 3B is a drawing showing a placement in the course of space movement processing.
Figure 3C:
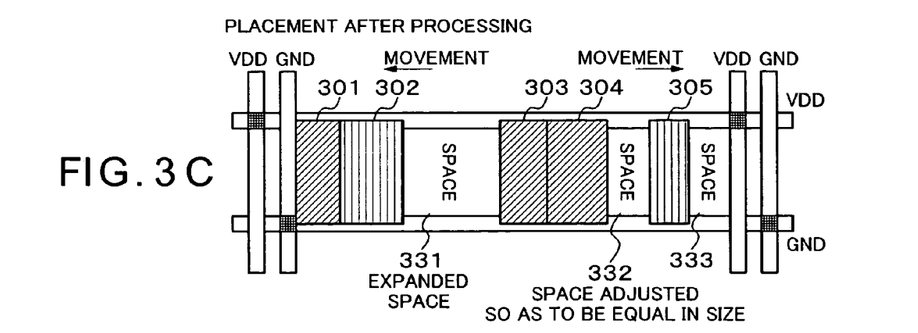
FIG. 3C is a drawing showing a placement after space movement processing.
Figure 4:
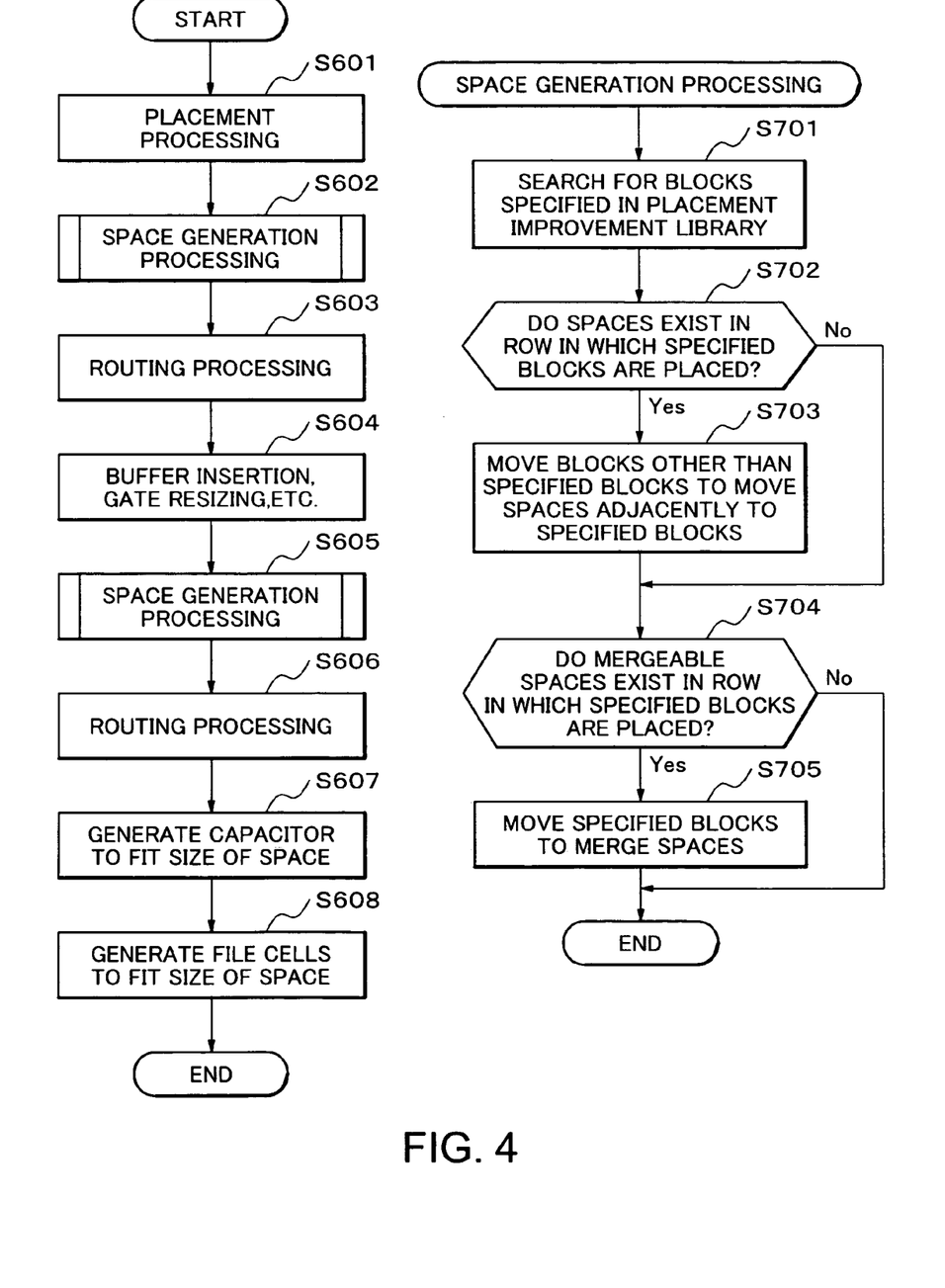
FIG. 4 is a flowchart showing the operation of a first embodiment of the present invention.

The following describes the operation of the first embodiment of the present invention with reference to the accompanying drawings. FIGS. 3A, 3B, and 3C are placement drawings for explaining the process of generating spaces by moving function blocks. FIG. 4 is a flowchart showing the operation of the first embodiment. The operation will be described with reference to FIGS. 3A, 3B, and 3C, and FIG. 4.

When the net list (input data) 201a is inputted, the placement unit 101 places function blocks taking delays between the function blocks and the degree of routing congestion into account, based on the coupling information between the function blocks described in the net list (input data) 201a (placement processing) (S601).

An example of the resulting placement is shown in FIG. 3A in a form convenient for explanation. Referring to FIG. 3A, five function blocks 301 to 305 are placed, and include a function block 302 prone to generate noise and a function block 305 susceptible to noise. The subsequent descriptions assume that the function block 302 requires a space at one side and the function block 305 requires a space at each side.

Power supply (VDD) lines and ground (GND) lines in a vertical direction are connected with VDD and GND lines in a horizontal direction by VIA. In FIGS. 3A, 3B, and 3C, spaces 311 to 315 in which no function block is placed are interspersed in a row area (represented by ROW in the flowchart) surrounded by the VDD and GND lines in the vertical direction and the VDD and GND lines in the horizontal direction.

The placement improvement unit 102 refers to the placement improvement library 203, and when the placed function blocks are registered as function blocks susceptible to noise or prone to generate noise, generates a space at each side or one side of the function blocks (space generation processing) (S602).

With reference to FIGS. 3A, 3B, 3C, and 4, space generation processing of the first embodiment will be described in detail. The placement improvement unit 102 searches for the locations of function blocks susceptible to noise or prone to generate noise that are specified in the placement improvement library 203 (S701).

The placement improvement unit 102 checks whether spaces in which no function block is placed exist in the vicinity of a row area in which the located, specified function blocks are placed (S702). When spaces exist, the placement improvement unit 102 moves function blocks other than the specified function blocks to move the spaces adjacently to the specified function blocks or merge the spaces by moving them (S703).

One example is shown in FIGS. 3A, 3B, and 3C. FIG. 3A shows the state of the row area in which the located, specified function blocks are placed. Although, in FIGS. 3B and 3C, spaces are moved within the same row area, a space search and movement range may also be specified in the placement improvement library 203, for example, to move the spaces within regions including adjacent row areas (subsequently shown as a second embodiment).

In the case of FIG. 3A, in Step S701, a function block 302 prone to generate noise and a function block 305 susceptible to noise are located. The placement improvement unit 102 checks the row area of FIG. 3A, and finds spaces 311, 312, and 313 in the vicinity of the function block 302. In the same way, the placement improvement unit 102 finds spaces 313, 314, and 315 in the vicinity of a function block 305.

There are several methods of generating spaces when plural specified function blocks such as the function blocks 302 and 305 are contained in a row area as shown in FIG. 3A. One method is to evenly split and allocate spaces between the specified function blocks. Another method is to previously weigh each of function blocks in the placement improvement library 203 and allocate spaces according to the weighing information. Space allocation methods are specified in the placement improvement library 203.

To move spaces adjacently to the specified function blocks, the placement improvement unit 102 moves unspecified function blocks. FIG. 3B shows the placement of function blocks after the function block 301 is moved to the left, the function block 303 to the right, and the function block 304 to the left from the placement of FIG. 3A. As a result, the space 311 is merged with the space 312 into an expanded space 321, and the space 313 becomes a space 322 and a part of a space 323. This movement expands spaces adjacent to the specified function blocks 302 and 305.

Next, the placement improvement unit 102 determines whether the spaces can be merged by moving the function blocks including the specified function blocks in the row area (S704), and if possible, moves the function blocks to merge the spaces (S705). Specifically, the placement improvement unit 102 refers to the placement improvement library 203 and determines whether spaces generated based on information indicating whether a space is required at each side or one side of the specified function blocks can be merged by moving the specified function blocks (S704).

In the case of FIG. 3, the function block 302 requires a space at one side thereof, the function block 305 requires a space at each side thereof, and the spaces 323 and 315 both have an adequate size. In this case, the spaces 321 and 322 can be merged by moving the function block 302 and are merged into a large space 331 (S705). FIG. 3C shows the placement of the function blocks after the merging.

The spaces 323 and 315 at both sides of the function block 305 are adjusted in width into a space 332 and a space 333 which have the same width. When the function block 305 is specified to have a space at each side thereof, and each of spaces after equalization does not satisfy a necessary amount, the process of equalizing spaces is not performed.

Although spaces are merged as described above in the first space generation processing, the present invention can be implemented without performing the merging, which is not mandatory in the present invention.

At the termination of the space generation processing and the placement of function blocks including spaces, the routing unit 103 routes the placed function blocks according to the net list (input data) 201a and the placement and routing library 202 (S603).

The placement addition unit 104 compares the routing result with predetermined limitation values, and inserts a function block 341 (FIG. 3D) being a buffer including logical elements in the middle of a routing, or changes a function block for driving a routing to a function block having a different driving power, for example, in the following cases: signal propagation delay is larger than a limitation value; a propagating waveform is duller than limitation; and the amount of crosstalk between adjacent routings is large (S604). Such techniques will not be described in detail because they are generally known.

Since the spaces generated and merged in Step S602 may be used by the placement addition unit 104, the placement improvement unit 102 again performs space generation processing (S605). The space generation processing is the same as the processing in Steps S701 to S705 already described.

The routing unit 103 performs routings in the same way as in Step S603 for uncompleted routing portions between the function blocks added by the placement addition unit 104 and the function blocks moved in Step S605 (S606).

The capacitor generation unit 105 adds a capacitor to a space in which no function block is placed and a capacitor can be mounted and which requires a capacitor (S607). Next, it disposes function blocks called fill cells for filling remaining spaces (S608). The capacitor generation unit 105 temporarily holds result data after the fill cells are placed, in a storage means as output data 204, and outputs the output data 204 as required.

The fill cells are function blocks conveniently provided to form structures for filling spaces between function blocks on an LSI board in LSI design by use of standard cells and the like. Capacitors including on-chip capacitor elements can be considered as a sort of fill cells.

Plural function blocks different in size from each other are provided as fill cells, and are checked in descending order of size to see if they fit in a space, and if so, the pertinent fill cell is generated. If not so, function blocks of smaller size are checked to see if they fit. In the present invention, also for capacitors, plural function blocks different in size from each other are provided. The present invention assumes that the size of capacitors is larger than the size of fill cells.

Figure 3D:
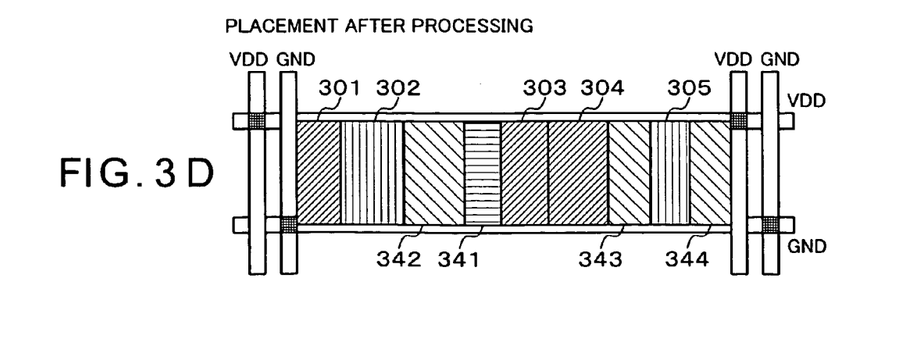
FIG. 3D is a drawing showing capacitors and the like placed in generated spaces.

The capacitor generation unit 105 checks whether capacitors can be mounted in a space, in descending order of capacitor size, and adds the largest mountable capacitor to the space. A capacitor 342 of FIG. 3D is an example of it. When no capacitor can be mounted, the capacitor generation unit 105 checks whether fill cells can be mounted, in descending order of fill cell size, and adds the largest mountable capacitor to the space.

FIG. 3D shows the placement of capacitors 343 and 344 in the spaces 332 and 333 adjusted so as to be equal in area size in FIG. 3C.

As described above, in the present invention, capacitors and fill cell are placed. However, for spaces not requiring capacitors and conditions unsuitable to place capacitors, fill cells may be placed instead of capacitors. There are no special limitations on the placement relationships between capacitors and fill cells.

In the above description, Step S603 is followed by Steps S604 to S606 to perform placement addition processing. However, if the placement addition processing is unnecessary, Steps S604 to S606 may be skipped after Step S603 to continue to capacitance placement processing of Step S607.

In this way, in the first embodiment, since the placement improvement unit 102 refers to the placement improvement library 203 to perform space generation processing, the possibility is increased that massed spaces capable of mounting capacitors can be allocated in the vicinity of function blocks prone to generate noise and function blocks susceptible to noise. As a result, larger on-chip capacitors can be placed adjacently to function blocks prone to generate noise and function blocks susceptible to noise, so that the generation and influence of noise inside the LSI can be significantly reduced.

The following describes a second embodiment of the present invention. The second embodiment is the same as the first embodiment except space generation processing. Therefore, space generation processing will be described. In the space generation processing of the second embodiment, a movement range of function blocks is expanded to vertical row areas.

The configuration of the second embodiment is the same as that of the first embodiment except the range of movement of function blocks by the placement improvement unit 102. Differences of the functions of the placement improvement unit 102 will be described in subsequent descriptions of operation.

Figure 5A:
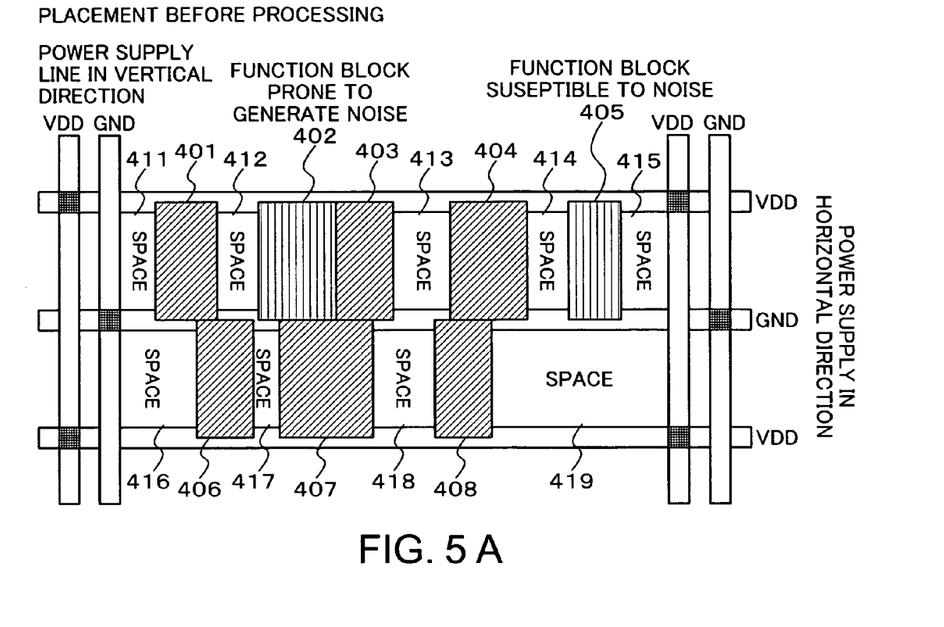
FIG. 5A is a drawing showing a placement before space movement processing.
Figure 5B:
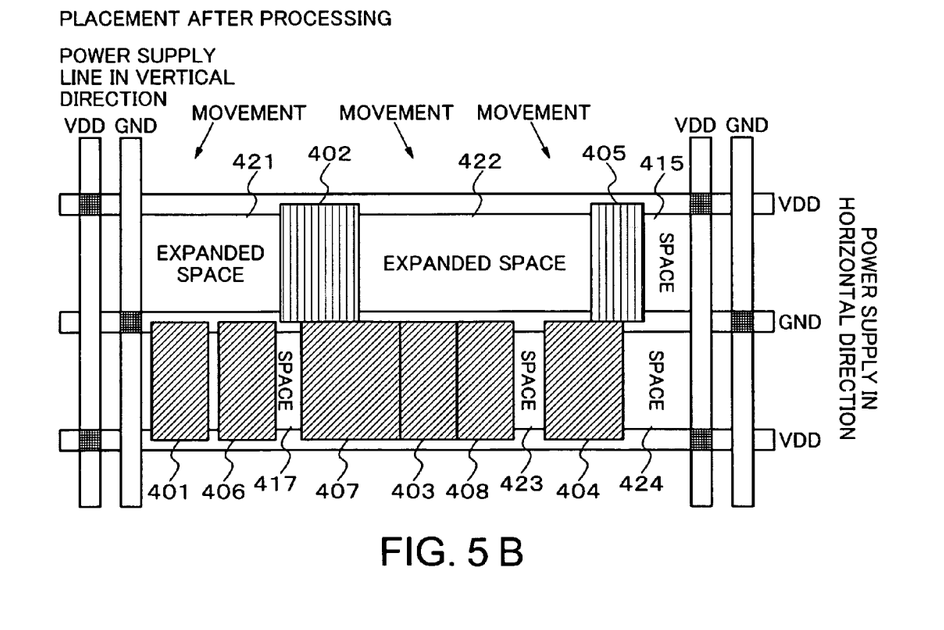
FIG. 5B is a drawing showing a placement after space movement processing.
Figure 6:
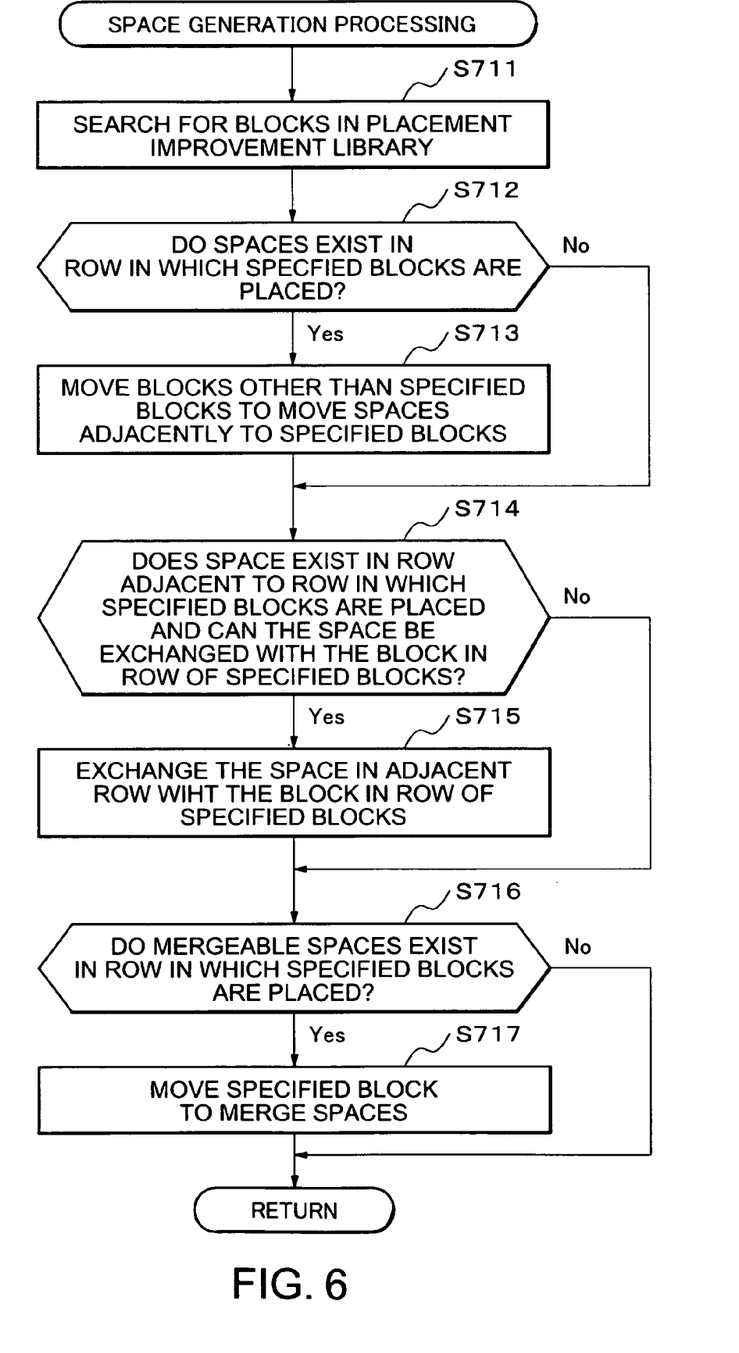
FIG. 6 is a flowchart showing the operation of space generation processing of a second embodiment of the present invention.

The following describes the operation of the space generation processing of the second embodiment with reference to FIGS. 5A and 5B, and FIG. 6. FIGS. 5A and 5B are placement drawings for explaining the space generation processing of the second embodiment, and FIG. 6 is a flowchart showing the operation of space generation processing of the second embodiment. A processing procedure of the second embodiment except the space generation processing is not described because it is the same as that of the first embodiment (Steps S601 to S607 of FIG. 4).

The placement improvement unit 102 executes Step S711 to S713 like Steps S701 to S703, and moves function blocks other than specified function blocks to generate massed spaces. FIG. 5A shows the placement of function blocks before their movement, and shows only a lower row area containing many spaces though adjacent vertical row areas are contained in a movement range.

In FIGS. 5A and 5B, a function block 402 is specified as a function block prone to generate noise, and a function block 405 is specified as a function block susceptible to noise. The placement of an upper row area of FIG. 5A is the same as the placement of a row area of FIG. 3. Therefore, the placement of an upper row area in Step S711 is changed as shown in FIG. 3B by processing of up to Step S713.

Next, in the second embodiment, the placement improvement unit 102 checks whether adjacent row areas have spaces to which the function blocks can be moved (S714). In FIG. 5A, since spaces exist in the lower row area, the placement improvement unit 102 determines that the function blocks 401, 403, and 404 can be moved. Next, the placement improvement unit 102 moves the movable function blocks to a different row area (S715). In the example of FIG. 5A, the placement improvement unit 102 moves the function block 401 to the left of a function block 406, the function block 403 to between function blocks 407 and 408, and the function block 404 to the right of a function block 408. FIG. 5B shows the placement of the moved function blocks.

The placement improvement unit 102, like Step S704, determines whether spaces can be merged by moving the specified function blocks (S716), and if so, like Step S7.05, merges the spaces by moving the specified function blocks (S717). Although the result is not shown, in FIG. 5B, if the function block 405 requires a space at each side thereof and the size of the space 415 is not sufficient, the function block 405 is moved to the left to obtain a sufficient amount of the space 415, or the function block 402 is moved to fit the sizes of spaces 421 and 422 to the size of a provided capacitor.

In this way, in the second embodiment, the placement improvement unit 102 expands the range of the movement of function blocks not only to the row area in which specified function blocks are placed, but also to adjacent row areas. As a result, since spaces for placing capacitors more effectively can be allocated, the generation and influence of noise inside the LSI can be significantly reduced.

The above descriptions include a method of moving function blocks within the row area in which specified function blocks are placed, to allocate spaces, and a method of moving function blocks as far as vertical row areas adjacent to the row area in which specified function blocks are placed, to allocate spaces. However, horizontal row areas and more vertical row areas may be included in the range of the movement of function blocks.

Besides the placement of LSI, when IC, LSI, and electrical elements are mounted on a printed circuit board, if IC, LSI, and electrical elements that are prone to generate noise or susceptible to noise are included, the present invention may be applied to automatically allocate regions for mounting capacitors in the vicinity of the IC, LSI, and electrical elements, so that the generation and influence of noise inside the printed circuit board can be reduced.

While this invention has been described with reference to illustrative embodiments, this description is not intended to be construed in a limiting sense. Various modifications of the illustrative embodiments as well as other embodiments of the invention will be apparent to persons skilled in the art upon reference to this description. It is, therefore, contemplated that the appended claims will cover any such modifications or embodiments as fall within the scope of the invention.

What is claimed is:

1. An element placement system comprising:
   a placement and routing library that stores placement information including element information about logical elements to be placed and region information of regions in which logical elements can be placed, and routing information necessary to execute routing;
   a placement improvement library that stores specified element information about specified logical elements being logical elements specified to place capacitors in the vicinity thereof;
   a placement unit that places logical elements according to input data containing connection data between logical elements and said placement information stored in said placement and routing library;
   a placement improvement unit that improves a result of placement by said placement unit by moving logical elements other than specified logical elements stored in the placement improvement library to collect spaces into the vicinity of said specified logical elements;
   a routing unit that routes logical elements after placement improvement by said placement improvement unit based on said input data; and
   a capacitor generation unit that places capacitors in said collected spaces.

2. The element placement system according to claim 1, wherein said placement improvement unit, after moving logical elements other than said specified logical elements, moves said specified logical elements to further collect spaces.

3. The element placement system according to claim 2, wherein the capacitors include a plurality of capacitors different in size, and said capacitor generation unit selectively places the largest mountable capacitor that is permitted for the size of spaces to place the capacitors in.

4. The element placement system according to claim 2, wherein said logical elements are function blocks, which are small circuits that are mounted in a semiconductor integrated circuit and perform basic operations.

5. The element placement system according to claim 1, wherein the specified element information stored in said placement improvement library includes the names of said specified logical elements, the size of capacitors to be placed in the vicinity of the specified logical elements, and placement side information specifying whether to place the capacitors to be placed at one side or each side of the specified logical elements, and the placement improvement unit collects spaces into one side or each side of said specified logical elements according to said placement side information.

6. The element placement system according to claim 1, further comprising:
   a placement addition unit that executes addition or change of logical elements for routings not satisfying preset conditions as a result of routing by said routing unit, including a process of inserting logical elements, which are relay use buffers,
   wherein after addition or change of logical elements by the placement addition unit, said placement improvement unit moves the added or changed logical elements, and the routing unit routes portions that have become necessary to replace as a result of the addition or change of logical elements.

7. The element placement system according to claim 1, wherein said placement improvement unit can, for a result of placement by said placement unit, move logical elements other than said specified logical elements stored in the placement improvement library to not only spaces of a row area in which said specified logical elements are placed, but also spaces of other row areas, to collect spaces into the vicinity of the specified logical elements.

8. An element placement method, comprising:
   a step a) of placing logical elements according to input data containing connection data between logical elements, and information about logical elements to be placed and placement information containing information of regions in which logical elements can be placed, said information about logical elements and said placement information being stored in a placement and routing library;
   a step b) of, for a result of said placement execution, referring to a placement improvement library that stores specified element information about specified logical elements specified to place capacitors in the vicinity thereof and moving logical elements other than said specified logical elements to collect spaces into the vicinity of an area in which the specified logical elements are placed;
   a step c) of, for said moved logical elements, executing routing based on the input data and routing information necessary to execute routing stored in the placement and routing library; and
   a step d) of placing capacitors in said collected spaces.

9. The element placement method according to claim 8, further comprising:
   a step e) of moving logical elements other than said specified logical elements in said step of moving logical elements other than specified logical elements, and then moving said specified logical elements to further collect spaces.

10. The element placement method according to claim 9, wherein said capacitors include a plurality of capacitors different in size, and in the step d of placing the capacitors in said collected spaces, the largest mountable capacitor is selectively placed that is permitted for the size of spaces to place the capacitors in.

11. The element placement method according to claim 9, wherein said logical elements are function blocks which are small circuits that are mounted in a semiconductor integrated circuit and perform basic operations.

12. A program embodied in electrical signals, said program enabling a computer to execute each step as claimed in claim 9.

13. The element placement method according to claim 8, wherein the specified element information stored in said placement improvement library includes the names of said specified logical elements, the size of capacitors to be placed in the vicinity of the specified logical elements, and placement side information specifying whether to place the capacitors to be placed at one side or each side of said specified logical element, and in said step of moving logical elements, the specified logical elements or other logical elements are moved to collect spaces into one side or each side of said specified logical elements according to said placement side information.

14. A program embodied in electrical signals, said program enabling a computer to execute each step as claimed in claim 13.

15. The element placement method according to claim 8, further comprising:
 a step f of executing addition or change of logical elements for routings not satisfying preset conditions as a result of routing after said step of executing routing, including a process of inserting logical elements, which are relay use buffers, and
 a step g of moving said added or changed logical elements to collect spaces into the vicinity of an area in which said specified logical elements are placed; and
 a step h of routing portions that have become necessary to replace as a result of the addition or change of logical elements for said result of routing.

16. A program embodied in electrical signals, said program enabling a computer to execute each step as claimed in claim 8.

* * * * *